(12) United States Patent
Gu

(10) Patent No.: US 6,505,266 B1
(45) Date of Patent: Jan. 7, 2003

(54) METHOD AND APPARATUS FOR A MIX SIGNAL MODULE

(76) Inventor: Jing Lu Gu, 1806 Yosemite Dr., Milpitas, CA (US) 95035

( * ) Notice: Subject to any disclaimer, the term of this patent is extended or adjusted under 35 U.S.C. 154(b) by 0 days.

(21) Appl. No.: 09/545,151

(22) Filed: Apr. 7, 2000

(51) Int. Cl.$^7$ .......................... G06F 13/38; G06F 12/00; H03M 1/00
(52) U.S. Cl. ........................................ 710/305; 341/126
(58) Field of Search .................. 710/305, 72; 341/110, 341/126, 144, 155; 379/1.02; 345/519, 520; 348/14.01, 126; 711/103

(56) References Cited

U.S. PATENT DOCUMENTS

| | | | |
|---|---|---|---|
| 4,933,675 A | * | 6/1990 | Beard |
| 4,947,171 A | * | 8/1990 | Pfeifer et al. |
| 5,664,218 A | * | 9/1997 | Kim et al. |
| 6,232,899 B1 | * | 5/2001 | Craven |

* cited by examiner

Primary Examiner—Gopal C. Ray

(57) ABSTRACT

An apparatus for generating an analog signal and methods of operating the same results in a cost effective solution for an audio sound generator. The apparatus for generating an analog signal comprises an I$^2$C interface configured to provide programming data in response to write control signals, a non-volatile memory coupled to the I$^2$C interface configured to store the programming data, a pulse width modulator coupled to the non-volatile memory configured to receive the programming data from the non-volatile memory and provide a pulse width modulated output in response to the programming data, and a d/a converter coupled to the non-volatile memory configured to receive the programming data from the non-volatile memory and provide an analog output in response to the programming data. The pulse width modulated output can be coupled to a piezoelectric speaker to produce audible sound. The analog output provides a line out signal that can be coupled to a dynamic speaker.

20 Claims, 7 Drawing Sheets

METHOD AND APPARATUS FOR A MIX SIGNAL MODULE

TECHNICAL FIELD

The present invention generally relates to a signal generator and more particularly to a method and apparatus for generating an analog signal from programmable data stored in a non-volatile memory of the apparatus.

BACKGROUND ART

With constant development of new process technologies for the manufacture of integrated circuits (IC), initial yields using these new process technologies are often less than desired. Many times, the defective ICs are fully functional except for certain sections of the ICs where data cells are damaged. Memory ICs in particular exhibit these kinds of register flaws.

Various techniques have been developed to deal with the flaws in the data cells. These techniques include setting aside extra registers in a memory IC during fabrication so that damaged sections of data cells can be reassigned to the extra registers. However, drawbacks with this technique include loss of die space that could be used for cell circuitry and a reduction in the number of components that are fabricated per square inch of die material. Moreover, there will always be instances when the number of registers set aside in anticipation of flawed data cells are not enough to cover the defective data cells.

Non-volatile memory, a special type of memory that is less widely used and much more expensive to manufacture than a typical random access memory (RAM) also experiences flaws associated with register damage during manufacture. Non-volatile memory has properties that enable the memory to be rewriteable and to retain its data even after power is removed from the memory. It is of particular value in applications where an electronic device must be turned off as in the case of digital cameras, video cameras, and other re-recordable audio and graphic capture devices.

In general, during the manufacture of IC devices, quality control for the completed ICs entails a series of verification tests that are designed to exercise the electronic circuitry of an IC. If the IC passes the verification tests, it is deemed good and packaged. If the IC fails a verification test, it is deemed bad and disposed. In the case of IC manufacturing of non-volatile memory such a s Flash memory or EEPROM (electrically erasable programmable read only memory), the process technology requires additional processing steps. The manufacturing costs of the increased processing steps add to the price of the non-volatile memory and cause much disparity between the price of nonvolatile memory and RAM. Thus, merely disposing a completed but defective nonvolatile memory IC because it did not pass a suite of quality control tests is not cost effective and becomes expensive. Particularly if the failure pertains to limited failures to sections of the data cells within the non-volatile memory.

Therefore, there is a need to develop practical applications for using ICs that are found to exhibit data cell failures.

DISCLOSURE OF THE INVENTION

The present invention provides an apparatus and a method for generating an analog signal from programmed digital data. The novel improved apparatus for generating an analog signal is based on an ability to use an IC memory that may exhibit errors in its data cells and programming the IC memory with digital data and converting the digital data to an analog signal. Thus, according to one aspect of the invention, the apparatus for generating an analog signal comprises an I²C interface configured to provide programming data in response to write control signals, a non-volatile memory coupled to the I²C interface configured to store the programming data, a pulse width modulator coupled to the non-volatile memory configured to receive the programming data from the non-volatile memory and provide a pulse width modulated output in response to the programming data, and a d/a converter coupled to the non-volatile memory configured to receive the programming data from the non-volatile memory and provide an analog output in response to the programming data.

According to another aspect of the invention, a piezoelectric speaker is coupled to the pulse width modulator configured to produce audible sound. The I²C interface receives read control signals to access the programming data stored in the non-volatile memory for output to the pulse width modulator. The pulse width modulator includes a first output pin and a second output pin coupled the piezoelectric speaker. The non-volatile memory may have data cell errors; however, even with data cell errors, the programmed data from the non-volatile memory still produces quality sound. Thus, even if the non-volatile memory may not have passed verification tests, the data cell errors do not adversely affect the sound produced from the piezoelectric speaker. The flawed non-volatile memory devices can be acquired at a reduced cost and when combined with an I²C interface and a PWM, the assembly provides a low cost re-recordable audio sound generator.

According to another aspect of the invention, a dynamic speaker is coupled to the d/a converter configured to produce audible sound. The I²C interface receives read control signals to access the programming data stored in the non-volatile memory for output to the d/a converter. Similarly to the piezoelectric speaker, data cell errors do not adversely affect the sound produced from the dynamic speaker. Human hearing is not sufficiently acute to perceive the data cell errors once the programming data in digital form is converted to analog form for output to the dynamic or piezoelectric speaker.

According to another aspect of the invention, the I²C interface includes a chip select configured to receive a chip select signal to activate the I²C interface. Multiple signal generator devices can be cascaded to provide extended storage of programming data.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
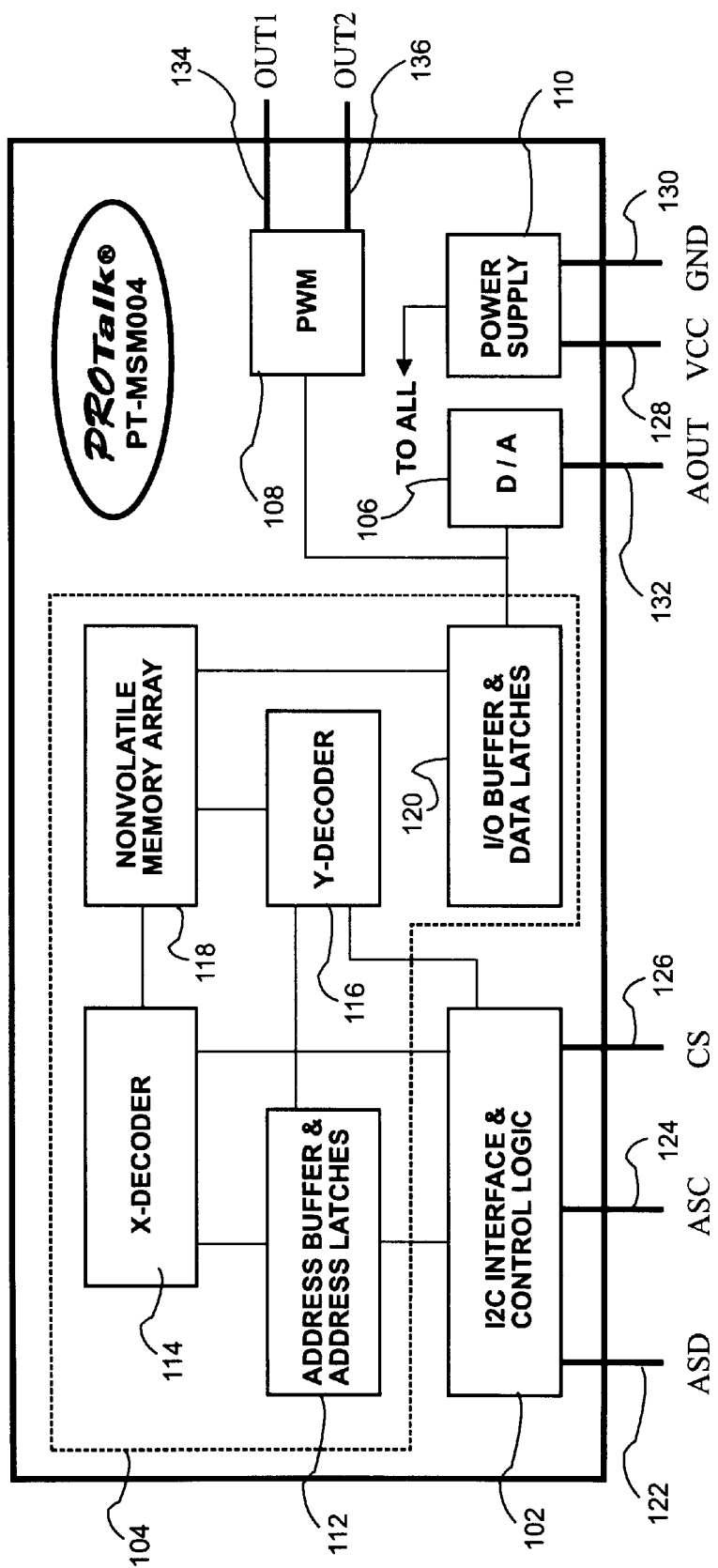
FIG. 1 illustrates a block diagram of a mix signal module according to the present invention.

FIG. 1 illustrates a block diagram of a mix signal module 10 according to the present invention. The mix signal module 10 includes an I²C interface 102, non-volatile memory 104 (denoted by dashed lines), d/a converter 106, pulse width modulator (PWM) 108, and power supply 110. The non-volatile memory 104 includes address buffers 112, x-decoder 114, y-decoder 116, memory array 118, and input and output (I/O) buffers 120. The non-volatile memory 104 is a conventional non-volatile memory that may include Flash memory, or a variety of EEPROMs (electrically erasable programmable read only memories). The d/a converter 106 and the PWM 108 receive digital data from the non-volatile memory 104 and convert the digital data to analog. The I²C interface 102 is preferably a serial bus such as the Philips I²C serial bus from Philips Corporation. The I²C protocol is a defined serial communication protocol of a DDC standard of the VESA committee. The I²C protocol provides bidirectional transfer of data via an asynchronous serial data (ASD) line 122 and is controlled by an asynchronous signal clock (ASC) on line 124. According to the present invention, a chip select (CS) on line 126 enables and disables the I²C interface 102.

The power supply 110 of the mix signal module 10 receives electrical power on line 128 for VCC and line 130 for ground (GND). The power supply 110 distributes the electrical power to the I²C interface 102, non-volatile memory 104, d/a converter 106, and PWM 108. The d/a converter 106 provides an analog output (AOUT) on line 132. The PWM 108 provides low current analog outputs out1 on line 134 and out2 on line 136. According to the present invention, supply voltage VCC to the power supply 110 is approximately 5.0 V dc.

In program mode, the I²C interface 102 provides an interface for a microcomputer or controller (not shown) to write program data to the memory array 118 of the non-volatile memory 104. CS on line 126 is enabled and data elements via ASD line 122 are coordinated with the ASC on line 124 for the transfer of the data elements to the address buffer 112. The x-decoder 114 and the y-decoder 116 coupled to the address buffer 112 decode address elements and access a memory location in the memory array 118 to which program data via ASD line 122 coordinated with ASC on line 124 is stored to the particular memory location. The program operation is repeated until the memory array 118 is programmed with the program data.

Once program data is stored in the non-volatile memory 104, the program data is accessed from the memory array 118 via the I²C interface 102. Address information is applied to the address buffer 112 and transferred to the x-decoder 114 and y-decoder 116. The x-decoder 114 and the y-decoder 116 apply the decoded address to the memory array 118 to access a particular location containing the program data. I/O buffer 120 receives the program data and applies the programmed data to the d/a converter 106 and PWM 108 for output.

Figure 2:
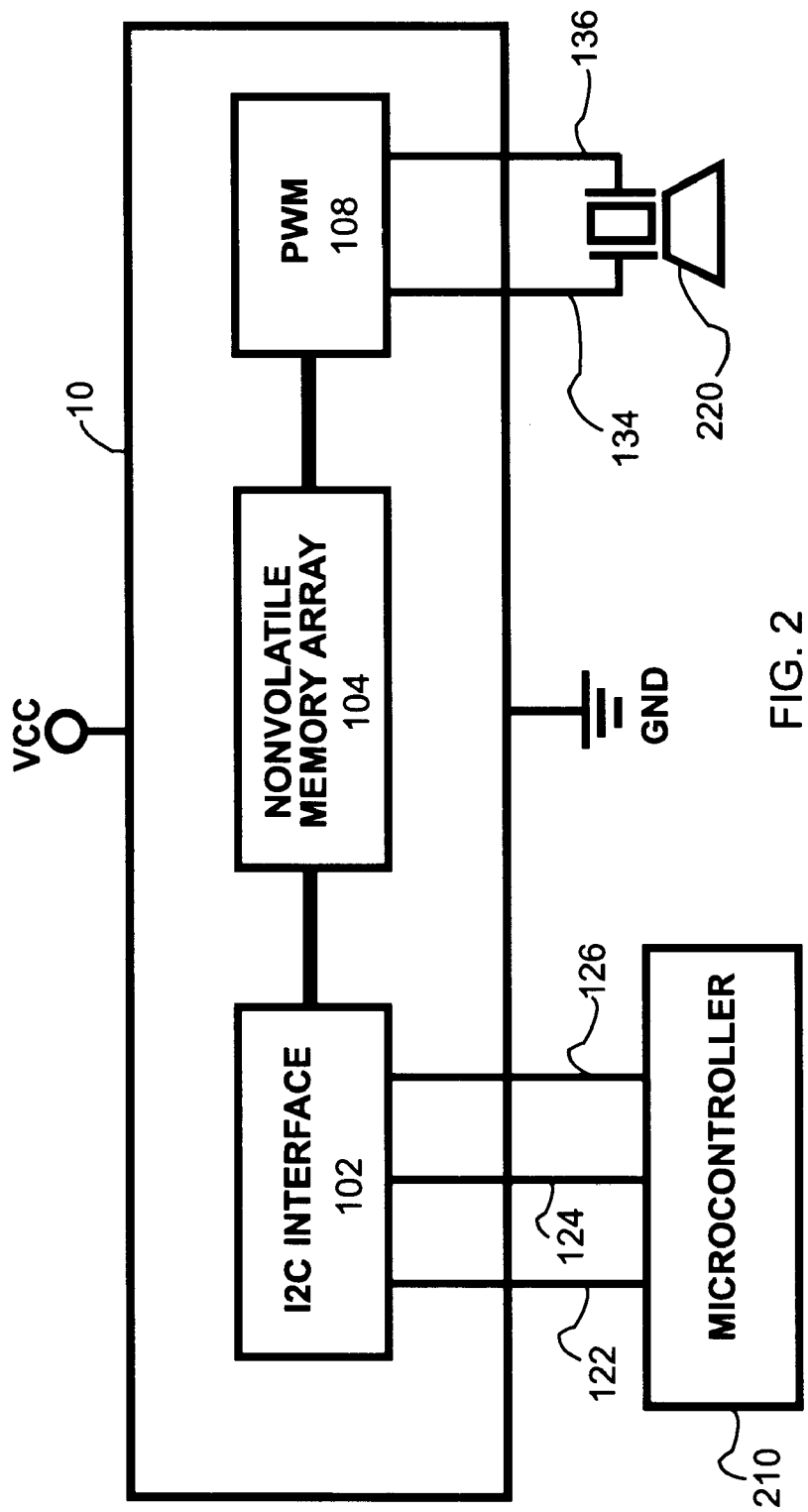
FIG. 2 illustrates an embodiment of the mix signal module driving a piezoelectric speaker.

FIG. 2 illustrates an embodiment of the mix signal module 10 configured to drive a low current piezoelectric speaker 220. The mix signal module 10 is coupled to VCC and GND for electrical power. A microcontroller 210 is coupled to the CS on line 126, ASD on line 122, and ASC on line 124 of the I²C interface 102 for programming and accessing program data stored in the non-volatile memory 104. As program data from the non-volatile memory 104 is applied to the PWM 108, the PWM 108 converts the digital data to a pulse width modulated signal to produce audio sound from the piezoelectric speaker 220. The piezoelectric speaker 220 is coupled to the low current analog outputs on line 134 and line 136 of the PWM 108 of the mix signal module 10.

Figure 3:
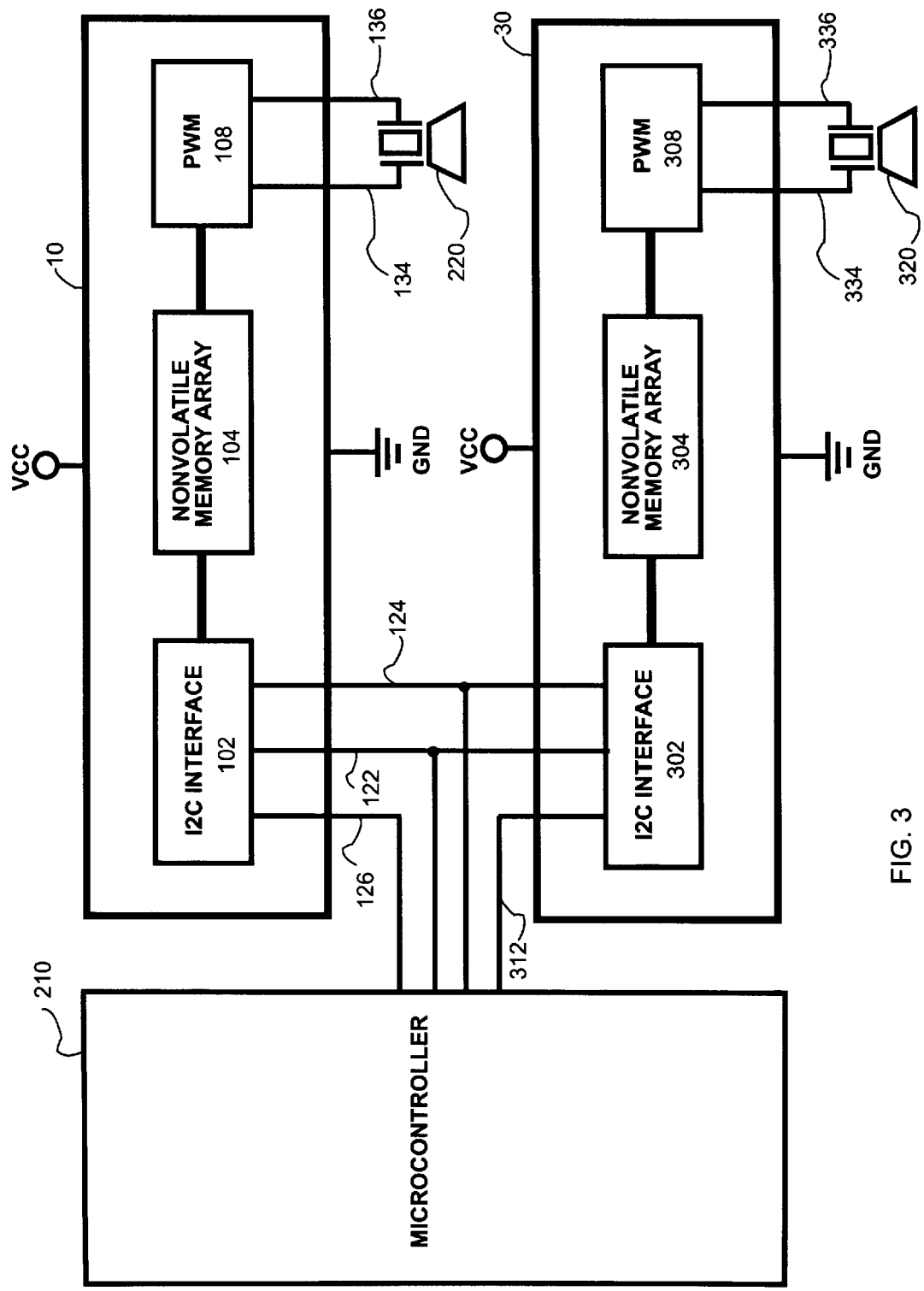
FIG. 3 illustrates an alternative embodiment of two mix signal modules driving two piezoelectric speakers for stereo audio sound.

FIG. 3 illustrates an embodiment of a first mix signal module 10 and a second mix signal module 30 configured to drive a first low current piezoelectric speaker 220 and a second low current piezoelectric speaker 320. The first mix signal module 10 and the second signal module 30 are coupled to VCC and GND for electrical power. A microcontroller 210 is coupled to the CS on line 126, ASD on line 122, and ASC on line 124 of the I²C interface 102 of the first mix signal module 10 for programming and accessing program data stored in the non-volatile memory 104. The microcomputer 210 is also coupled to the CS on line 312, ASD on line 122, and ASC on line 124 of the I²C interface 302 of the second mix signal module 30 for programming and accessing program data stored in the non-volatile memory 304. Program data from the non-volatile memory 104 is applied to the PWM 108 of the first mix signal module 10, and the PWM 108 converts the digital data to a pulse width modulated signal for production of audio sound from the piezoelectric speaker 220. The piezoelectric speaker 220 is coupled to the low current analog outputs on line 134 and line 136 of the PWM 108 of the first mix signal module 10. Similarly, program data from the non-volatile memory 304 is applied to the PWM 308 of the second mix signal module 30, and the PWM 308 converts the digital data to a pulse width modulated signal for production of audio sound from the piezoelectric speaker 320. The piezoelectric speaker 320 is coupled to the low current analog outputs on line 334 and line 336 of the PWM 108 of the mix signal module 30.

Figure 4:
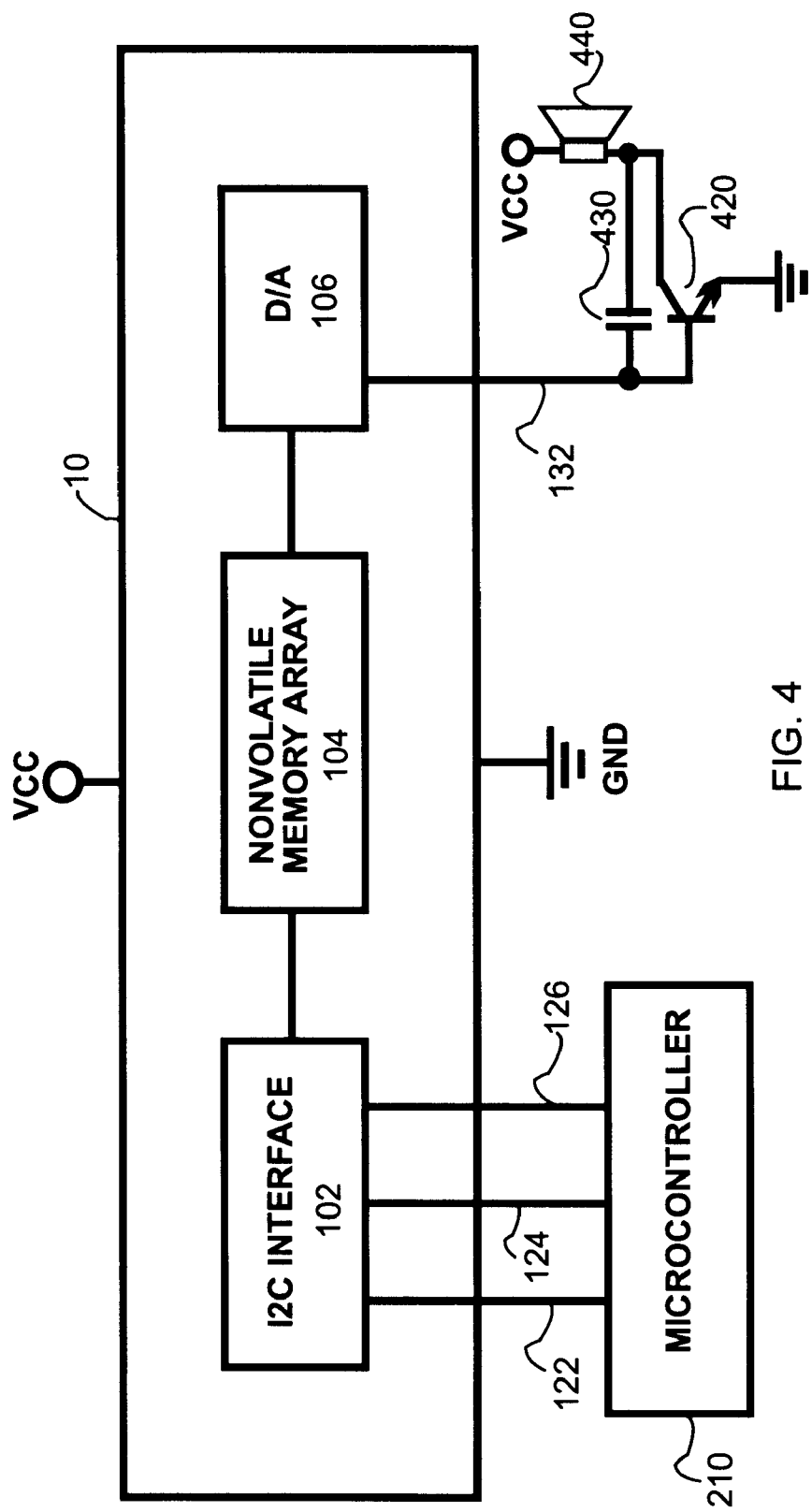
FIG. 4 illustrates an alternative embodiment of the mix signal module driving a dynamic speaker.

FIG. 4 illustrates another embodiment of the mix signal module 10 configured to drive a dynamic speaker 440. The mix signal module 10 is coupled to VCC and GND for electrical power. A microcontroller 210 is coupled to the CS on line 126, ASD on line 122, and ASC on line 124 of the I²C interface 102 for programming and accessing program data stored in the non-volatile memory 104. Program data from the non-volatile memory 104 is applied to the d/a converter 106, and the d/a converter 106 converts the digital data to an analog signal AOUT on line 132. The transistor 420 and capacitor 430 coupled to the AOUT on line 132 provides amplification of the analog signal AOUT to produce audio sound from the dynamic speaker 340. Alternatively, the analog signal AOUT on line 132 may be coupled to a low pass filter and produce a line out signal for coupling to amplifiers and other devices that can receive line out inputs. It should also be noted that a multiple speaker stereophonic system could be implemented with an addition of a second or more mix signal modules 10.

Figure 5:
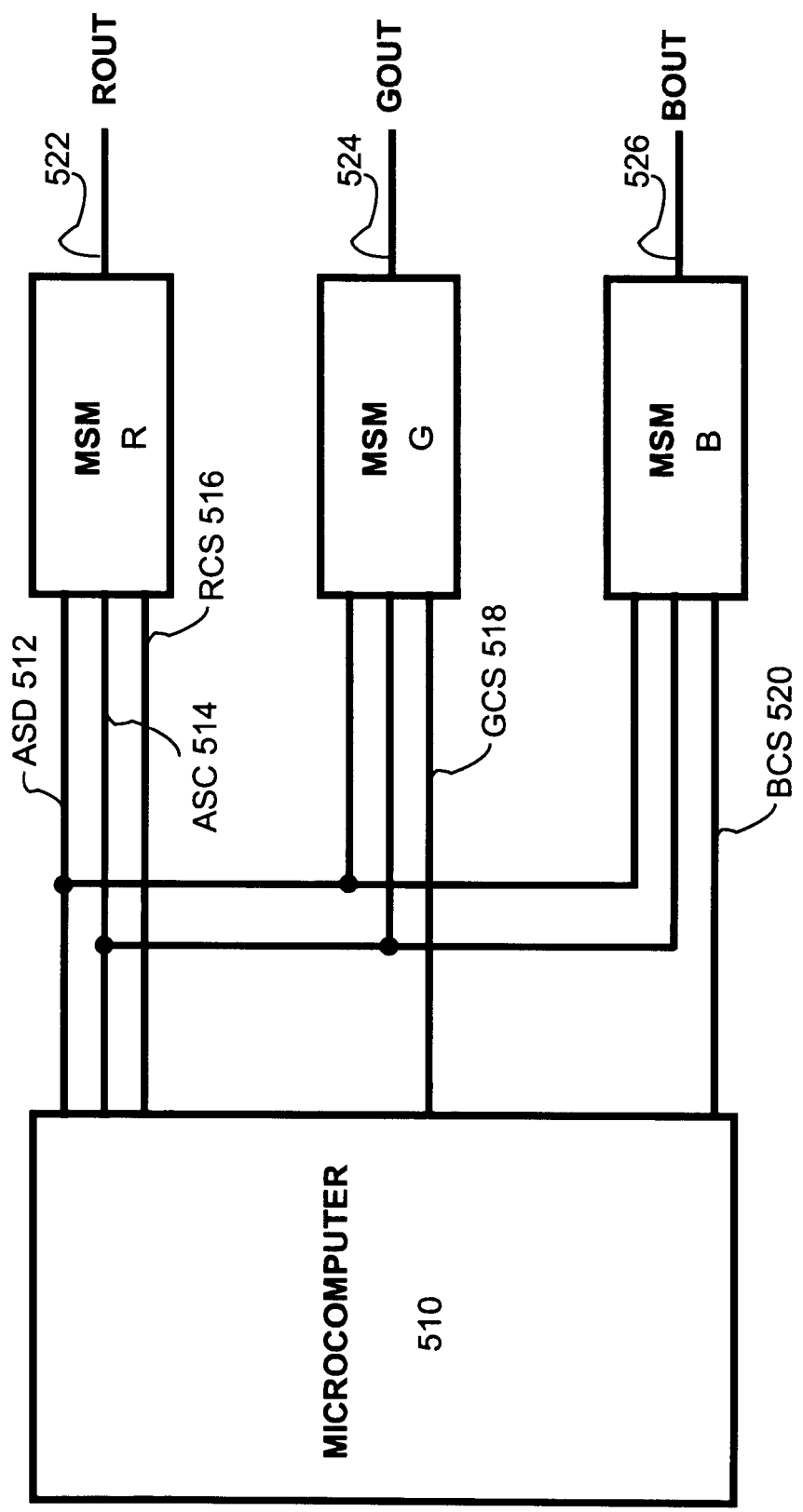
FIG. 5 illustrates an embodiment of three mix signal modules configured as an RGB display driver.

FIG. 5 illustrates an embodiment of multiple mix signal modules R, G, and B configured to drive an RGB display device. A microcomputer 510 is coupled to asynchronous serial data ASD I/O on line 512 and asynchronous signal clock ASC on line 514 of the I²C interface for the mix signal modules R, G, and B. The chip select CS of each mix signal module R, G, and B are individually enabled by the microcomputer 510. Accordingly, signal RCS is coupled to the microcomputer 510 on line 516; signal GCS is coupled to the microcomputer 510 on line 518, and signal BCS is coupled to the microcomputer 510 on line 520. During programming, the microcomputer 510 individually enables CS for each mix signal modules R, G, and B to store program data to each respective non-volatile memory. Once programmed, each mix signal module R, G, and B includes program data for driving the R component, G component, and B component of an RGB signal.

In operation, the microcomputer 510 issues commands to access the program data stored in the memory arrays of the mix signal modules R, G, and B. The program data is applied to each of the d/a converters in the mix signal modules R, G, and B. An ROUT signal on line 522, GOUT signal on line 524, and BOUT signal on line 526 provide the RGB signal for output to a display device.

Figure 6:
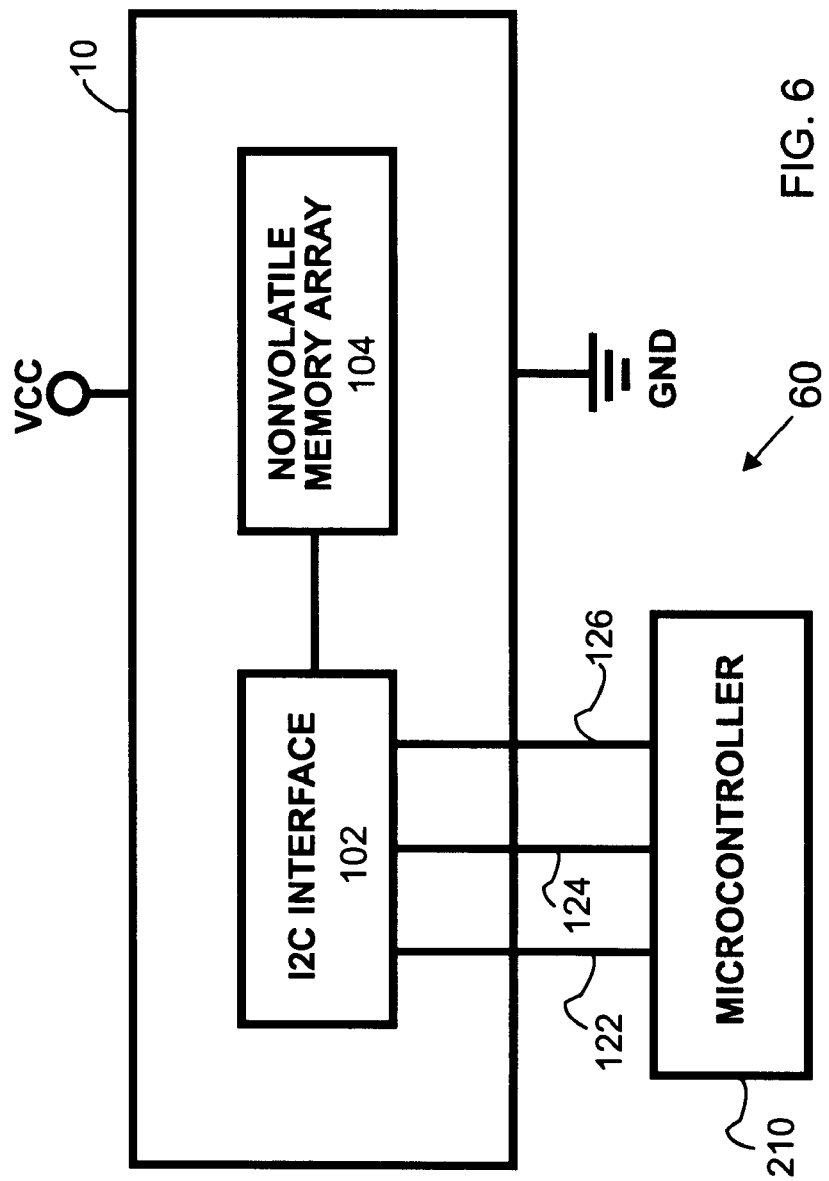
FIG. 6 illustrates an embodiment of the mix signal module configured as a nonvolatile digital data memory.

FIG. 6 illustrates an embodiment of the mix signal module 10 configured as a non-volatile digital data memory 60. The non-volatile digital data memory 60 includes a mix signal module 10 and a microcontroller 210. The mix signal module 10 includes an I$^2$C interface 102 and a non-volatile memory array 104. The mix signal module 10 receives electrical power from connections to VCC and GND. The microcontroller 210 is coupled to a plurality of control and data lines CS on line 126, ASD on line 122, and ASC on line 124 of the I$^2$C interface 102 of the mix signal module 10. The plurality of control and data lines uses the I$^2$C protocol for transceiving digital data to and from the non-volatile memory array 104.

Figure 7:
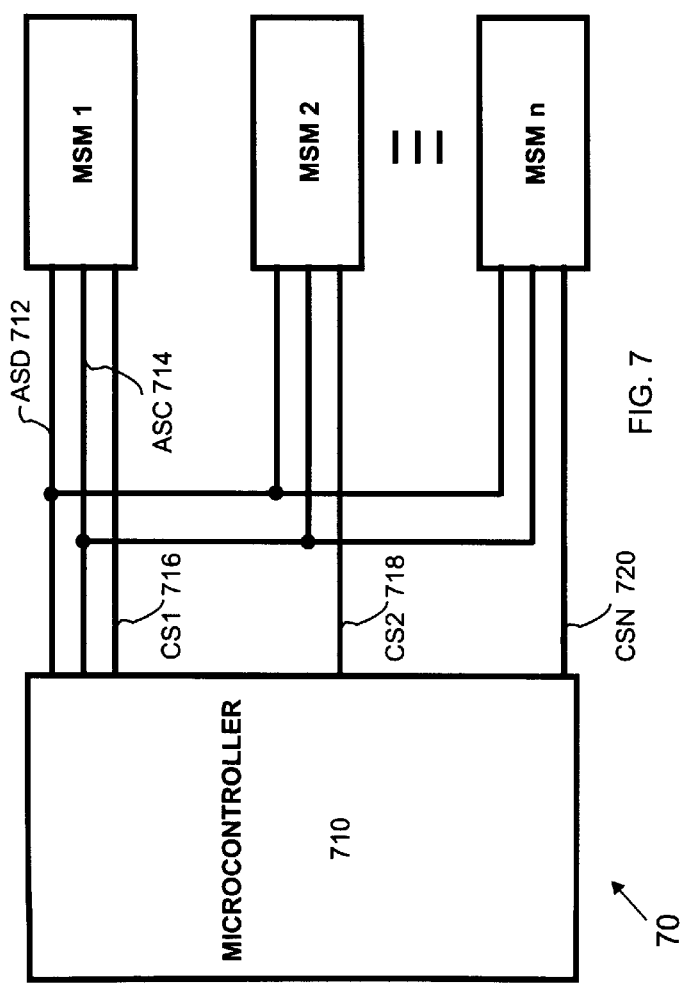
FIG. 7 illustrates an embodiment of a plurality of mix signal modules configured as an expanded nonvolatile data storage module.

FIG. 7 illustrates an embodiment of multiple mix signal modules 10 cascaded to provide an expanded data storage module 70. The expanded data module 70 includes a microcontroller 710, mix signal module 1, mix signal module 2, and mix signal module n. The microcontroller 710 includes an asynchronous serial data ASD I/O on line 712 and an asynchronous signal clock ASC on line 714 that is coupled to the mix signal module 1, mix signal module 2, and mix signal module n. The chip select CS for each mix signal module is individually controlled by the microcontroller 710 so that only one mix signal module of the multiple mix signal modules 1, 2, . . . n is selected and active at one time. In operation, the microcontroller 710 selects MSM 1 by activating CS1 on line 716 and stores program data to the non-volatile memory of MSM 1 via asynchronous serial data ASD I/O on line 712. The program data is coordinated with the asynchronous signal clock ASC on line 714 during the program data transfer. As the non-volatile memory 104 of MSM 1 fills, the microcontroller 710 deselects MSM 1 and selects another mix signal module for the program data. In the present example, the microcontroller 710 selects MSM 2 by activating CS2 on line 718. By application of the I$^2$C interface of the mix signal modules, program data is stored into the non-volatile memory of the MSM 2. As memory locations of the MSM 2 are filled, the microcontroller 710 deselects MSM 2 and selects MSM n by activating CSn on line 720. By application of the I$^2$C interface of the mix signal modules, program data is stored into the non-volatile memory of the MSM n.

To retrieve the program data stored in the expanded data storage module 70, the microcontroller 710 selects a particular mix signal module by activating the chip select signal for the particular mix signal module and accesses the particular mix signal module by application of the I$^2$C protocol. For example, to select MSM 2, the microcontroller 710 activates the CS2 on line 718. The microcomputer 710 retrieves the program data stored in the non-volatile memory of the MSM 2 by application of the I$^2$C protocol. Other MSMs of the expanded data storage module 70 are similarly accessed. The expanded data storage module 70 affords a cost effective, expandable data storage for digital data.

Figure 8:
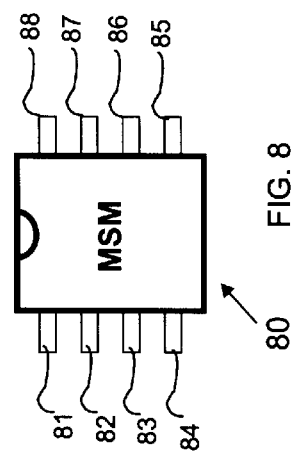
FIG. 8 illustrates the mix signal module packaged in a small eight pin package according to the present invention.

FIG. 8 illustrates the mix signal module 10 encased as an eight pin package 80 according to the present invention. The eight pin package 80 provides I/O connections to the mix signal module 10 which include VCC pin 81, GND pin 82, ASD pin 83 ASC pin 84, CS pin 85, AOUT pin 86, OUT1 pin 87, and OUT2 pin 88. The eight pin DIP is well suited for integrated circuit (IC) board applications. The IC board can be expanded by the addition of one or more eight pin packages. Accordingly, an IC board having the expanded data storage module 70 is expandable with a plurality of eight pin packages to suit expanded needs for increased program data storage.

While the invention has been described in conjunction with particular best mode embodiments, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. An apparatus for generating an analog signal comprising:
   an I$^2$C interface configured to provide programming data in response to write control signals;
   a non-volatile memory coupled to the I$^2$C interface configured to store the programming data;
   a pulse width modulator coupled to the non-volatile memory configured to receive the programming data from the non-volatile memory and provide a pulse width modulated output in response to the programming data; and
   a d/a converter coupled to the non-volatile memory configured to receive the programming data from the non-volatile memory and provide an analog output in response to the programming data.

2. The apparatus as claimed in claim 1 further comprising a piezoelectric speaker coupled to the pulse width modulator configured to produce audible sound.

3. The apparatus as claimed in claim 2, wherein the I$^2$C interface receives read control signals to access the programming data stored in the non-volatile memory for output to the pulse width modulator.

4. The apparatus as claimed in claim 2, wherein the pulse width modulator includes a first output pin and a second output pin coupled the piezoelectric speaker.

5. The apparatus as claimed in claim 1 further comprising a dynamic speaker coupled to the d/a converter configured to produce audible sound.

6. The apparatus as claimed in claim 5, wherein the I$^2$C interface receives read control signals to access the programming data stored in the non-volatile memory for output to the d/a converter.

7. The apparatus as claimed in claim 1, wherein the I$^2$C interface includes a chip select configured to receive a chip select signal to activate the I$^2$C interface.

8. The apparatus as claimed in claim 7 comprises an eight pin package.

9. The apparatus as claimed in claim 1, wherein the non-volatile memory includes Flash memory.

10. The apparatus as claimed in claim 1, wherein the non-volatile memory includes EEPROM.

11. A system for generating an RGB signal to a video display comprising:
   a first signal generator having:
      an I²C interface configured to provide programming data in response to write control signals;
      a non-volatile memory coupled to the I²C interface configured to store the programming data; and
      a d/a converter coupled to the non-volatile memory configured to receive the programming data from the non-volatile memory and provide an analog R output in response to the programming data;
   a second signal generator having:
      an I²C interface configured to provide programming data in response to write control signals;
      a non-volatile memory coupled to the I²C interface configured to store the programming data; and
      a d/a converter coupled to the non-volatile memory configured to receive the programming data from the non-volatile memory and provide an analog G output in response to the programming data; and
   a third signal generator having:
      an I²C interface configured to provide programming data in response to write control signals;
      a non-volatile memory coupled to the I²C interface configured to store the programming data; and
      a d/a converter coupled to the non-volatile memory configured to receive the programming data from the non-volatile memory and provide an analog B output in response to the programming data;
   wherein a read control signal coupled to the I²C interface of the first signal generator, the second signal generator, and the third signal generator accesses the non-volatile memory of the first signal generator, the second signal generator, and the third signal generator to provide the programming data to an input of the d/a converter of the first signal generator, the second signal generator, and the third signal generator, respectively.

12. The system as claimed in claim 11, wherein the first signal, the second signal-generator, and the third signal generator includes a pulse width modulator coupled to the non-volatile memory of the first signal generator, the second signal generator, and the third signal generator each configured to provide pulse width modulated signals in response to the programming data stored in the respective non-volatile memory of the first signal generator, the second signal generator, and the third signal generator.

13. The system as claimed in claim 11, wherein:
   the first signal generator comprises an eight pin package;
   the second signal generator comprises an eight pin package; and
   the third signal generator comprises an eight pin package.

14. The system as claimed in claim 11, wherein the I²C interface of the first signal generator, the second signal generator, and the third signal generator each include a chip select configured to receive a chip select signal to activate the I²C interface.

15. The system as claimed in claim 11, wherein the non-volatile memory of the first signal generator, the second signal generator, and the third signal generator includes Flash memory.

16. A method of operating a signal generator having an I²C interface comprising the steps:
   programming memory locations of a non-volatile memory via the I²C interface;
   accessing the memory locations of the non-volatile memory via the I²C interface to provide output data;
   transferring the output data from the non-volatile memory to a pulse width modulator having a first output pin and a second output pin configured to provide a pulse width modulated signal to the first output pin and the second output pin in response to the output data; and
   generating audio sound from a piezoelectric speaker coupled to the first output pin and the second output pin of the pulse width modulator.

17. The method as claimed in claim 16 further comprising the steps:
   transferring the output data from the non-volatile memory to a d/a converter having a third output pin; and
   generating audio sound from a dynamic speaker coupled to the third output pin of the d/a converter.

18. The method as claimed in claim 16, wherein the I²C interface includes a chip select configured to receive a chip select signal to activate the I²C interface.

19. The method as claimed in claim 16, wherein the non-volatile memory includes a Flash memory.

20. The method as claimed in claim 16, wherein the signal generator includes an eight pin package.

* * * * *